United States Patent
Chen et al.

(10) Patent No.: US 12,339,310 B1
(45) Date of Patent: Jun. 24, 2025

(54) METHOD FOR MONITORING DEGRADATION MECHANISM OF SWITCH DEVICE IN POWER CONVERSION CIRCUIT

(71) Applicant: China Electronic Product Reliability And Environmental Testing Research Institute, Guangzhou (CN)

(72) Inventors: Yiqiang Chen, Guangzhou (CN); Haofan Long, Guangzhou (CN); Bo Hou, Guangzhou (CN); Changjian Zhou, Guangzhou (CN)

(73) Assignee: China Electronic Product Reliability And Environmental Testing Research Institute, Guangzhou (CN)

( * ) Notice: Subject to any disclaimer, the term of this patent is extended or adjusted under 35 U.S.C. 154(b) by 0 days.

(21) Appl. No.: 19/054,780

(22) Filed: Feb. 15, 2025

(30) Foreign Application Priority Data

Aug. 2, 2024 (CN) .......................... 202411054456.6

(51) Int. Cl.
*G01R 31/27* (2006.01)
*G01R 31/26* (2020.01)
*G01R 19/00* (2006.01)

(52) U.S. Cl.
CPC ....... *G01R 31/275* (2013.01); *G01R 31/2646* (2013.01); *G01R 19/0092* (2013.01)

(58) Field of Classification Search
CPC .............. G01R 31/275; G01R 31/2646; G01R 19/0092
See application file for complete search history.

(56) References Cited

U.S. PATENT DOCUMENTS

| | | | |
|---|---|---|---|
| 11,435,395 B2 * | 9/2022 | Lee | G01R 31/3275 |
| 2022/0065933 A1 * | 3/2022 | Tseng | H02H 7/1216 |
| 2024/0313764 A1 * | 9/2024 | Pidutti | H03K 17/6871 |

FOREIGN PATENT DOCUMENTS

| | | |
|---|---|---|
| CN | 116047153 A | 5/2023 |
| CN | 118112386 A | 5/2024 |

OTHER PUBLICATIONS

CNIPA, Notification of a First Office Action for CN202411054456.6, Sep. 14, 2024.
China Institute of Electronic Product Reliability and Environmental Testing (Applicant), Replacement claims (allowed) of CN202411054456.6, Sep. 27, 2024.
CNIPA, Notification to grant patent right for invention in CN202411054456.6, Oct. 11, 2024.

\* cited by examiner

*Primary Examiner* — Dominic E Hawkins
(74) *Attorney, Agent, or Firm* — Hemisphere Law, PLLC; Zhigang Ma

(57) ABSTRACT

In a method for monitoring a degradation mechanism of a switch device in a power conversion circuit. When individually determining the degradation mechanism of internal defects of the switch device, it is determined through a change trend of a real-time current change rate that internal defect degradation is caused by an increase of an oxide layer defect density or an interface defect density. It is confirmed through a decrease in the real-time current change rate that internal defect degradation is caused by the increase of the oxide layer defect density. When the real-time current change rate increases, it is determined through a secondary testing including the on-state resistance and low-frequency noise testing that degradation is caused by accurate packaging and/or the increase of the interface defect density.

8 Claims, 2 Drawing Sheets

METHOD FOR MONITORING DEGRADATION MECHANISM OF SWITCH DEVICE IN POWER CONVERSION CIRCUIT

CROSS-REFERENCE TO RELATED APPLICATION

This application claims priority to Chinese Patent Application No. 202411054456.6, filed on Aug. 2, 2024, which is herein incorporated by reference in its entirety.

TECHNICAL FIELD

The disclosure relates to the field of semiconductor technologies, and more particularly to a method for monitoring a degradation mechanism of a switch device in a power conversion circuit.

BACKGROUND

Methods for monitoring a power conversion circuit switch device in the related art typically employ sensors such as current transformers, Rogowski coils, and Hall sensors etc., to monitor current and voltage signals of power electronic components of equipment systems in an online monitoring manner, thereby obtaining fault information of circuits, modules, or systems. These methods can only diagnose relatively apparent system faults and cannot predict degradation trends of switch devices. For instance, a Chinese patent literature with the application No. 202310163156.0 (the publication No. CN116047153A), published on May 2, 2023, discloses a system fault perception method, a system fault perception device, a computer equipment, and a storage medium. The system fault perception method determines a degradation trend of a system to be inspected by comparing real-time voltage oscillation signals collected by a voltage sensor with reference voltage oscillation signals. However, degradation of a switch device is influenced by various factors, and this system fault perception method cannot monitor a degradation mechanism of the switch device.

SUMMARY

In view of the foregoing, a purpose of the disclosure is to provide a method for monitoring a degradation mechanism of a switch device in a power conversion circuit, to determine the degradation mechanism of internal defects of the power conversion circuit switch device by a change trend of the real-time current change rate.

In order to solve above technical problems, the technical solutions of the disclosure are as follows.

The disclosure provides the method for monitoring the degradation mechanism of the switch device in the power conversion circuit, including the following steps:

S1, disposing a sensor on a loop where a source and a drain of the switch device are located;

S2, obtaining a reference current change rate of a drain-source current of the switch device;

S3, collecting, by the sensor, a real-time current change rate of the drain-source current during the switch device is in an on-state;

S4, comparing the real-time current change rate of the drain-source current with the reference current change rate of the drain-source current; and S5, determining the degradation mechanism of internal defects of the switch device according to a change trend of the real-time current change rate, judging that degradation is caused by an increase of an oxide layer defect density of the switch device when the real-time current change rate is decreased; judging that degradation is caused by an increase of an interface defect density when the real-time current change rate is increased.

In an embodiment, the method further includes: judging a degradation degree of the switch device based on the degradation mechanism, replacing the switch device in the power conversion circuit when the degradation degree is apparent, to avoid failures in the entire power conversion circuit during operation, and optimizing the design of the switching device or the power conversion circuit based on the degradation mechanism of the switch device.

In an embodiment, the determining the degradation mechanism of internal defects of the switch device according to a change trend of the real-time current change rate specifically includes:

calculating a relationship between the oxide layer defect density Not and the real-time current change rate $\partial i_D(t)/\partial t$, and a relationship between the interface defect density Nit and the real-time current change rate $\partial i_D(t)/\partial t$ according to the following formulas:

$$\partial i_D(t)/\partial t = [(V_G - V_{TH})/(R_G C_{oss}/g_m) + L_{loop}];$$

$$\partial V_{TH}/\partial N_{it} = q/C_{ox} > 0;$$

$$\partial V_{TH}/\partial N_{ot} = q/C_{ox} < 0;$$

$$\partial g_m/\partial N_{it} < 0;$$

$$\partial g_m/\partial N_{ot} > 0;$$

where $V_G$ represents a gate voltage, VTH represents a threshold voltage, $R_G$ represents a resistance of the loop where the source and the drain are located, $C_{oss}$ represents a capacitance of the loop where the source and the drain are located, $L_{loop}$ represents an inductance of the loop where the source and the drain are located, $C_{ox}$ represents a gate oxide layer capacitance, q represents a charge quantity of electron, and $g_m$ represents a transconductance.

In an embodiment, the determining the degradation mechanism of internal defects of the switch device according to a change trend of the real-time current change rate in the step S5 specifically includes the following steps:

A1, in response to the real-time current change rate being decreased, judging that degradation is internal defect degradation of the switch device caused by the increase of the oxide layer defect density; whereas, in response to the real-time current change rate being increased, performing the following step A2;

A2, comparing a real-time on-state resistance with a reference on-state resistance, in a linear region; and testing the interface defect density of the switch device through low-frequency noise at a frequency in a range of 1-100 Hertz;

A3, in response to the real-time on-state resistance being less than the reference on-state resistance and the interface defect density being increased, judging that degradation is internal defect degradation of the switch device caused by the increase of the interface defect density;

in response to the real-time on-state resistance being greater than the reference on-state resistance and the interface defect density being with no change, judging that degradation of the switch device is packaging degradation;

in response to the real-time on-state resistance being greater than the reference on-state resistance and the interface defect density being increased, judging that both packaging degradation, and internal defect degradation of the switch device caused by the increase of the interface defect density occurred on the switch device.

In an embodiment, the step S5 further includes:

collecting a real-time current change rate of the drain-source current during the switch device is in an on-state in a next time; in response to the real-time current change rate of the drain-source current in the next time being relatively increased compared to the real-time current change rate collected in the S3, measuring the real-time on-state resistance in the linear region, and simultaneously testing the interface defect density of the switch device through the low-frequency noise;

in response to the real-time on-state resistance being greater than the reference on-state resistance and the interface defect density being increased, judging that packaging degradation and internal defect degradation of the switch device caused by the increase of the oxide layer defect density and the increase of the interface defect density occurred during the switch device is in use;

in response to the real-time on-state resistance being greater than the reference on-state resistance and the interface defect density being with no change, judging that packaging degradation and internal defect degradation of the switch device caused by the increase of the interface defect density occurred during the switch device is in use;

in response to the real-time on-state resistance being less than the reference on-state resistance and the interface defect density being increased, judging that internal defect degradation caused by the increase of the oxide layer defect density and the increase of the interface defect density occurred during the switch device is in use.

In an embodiment, the step S5 further includes: presetting a relationship between a first change amplitude of the real-time current change rate of the drain-source current relative to the reference current change rate of the drain-source current and a degradation degree of an oxide layer defect, and determining the degradation degree of the oxide layer defect based on the first change amplitude.

In an embodiment, the step S5 further includes: presetting a relationship between the first change amplitude of the real-time current change rate of the drain-source current relative to the reference current change rate of the drain-source current and a degradation degree of an interface defect, and determining the degradation degree of the interface defect based on the first change amplitude.

In an embodiment, the sensor is a radio frequency current probe. The disposing a sensor in the S1 specifically includes: disposing the radio frequency current probe to be contacted with a surface of a wire of the loop where the source and drain are located.

In an embodiment, a heat dissipation device is disposed on the switch device, and the S1 further includes: activating the heat dissipation device.

In an embodiment, the heat dissipation device is a water-cooling heat dissipation device.

Compared to the related art, the method for monitoring the degradation mechanism of the switch device provided by the disclosure has the following beneficial effects.

The oxide layer defect density is positively correlated with the change trend of the real-time current change rate, while the interface defect density is negatively correlated with the change trend of the real-time current change rate. When individually determining the degradation mechanism of the internal defects of the switch device, it is determined based on the change trend of the real-time current change rate that the internal defect degradation of the switch device is caused by the increase of the oxide layer defect density or the interface defect density. Additionally, the switch device can also experience the packaging degradation. When the packaging degradation occurs, it leads to an increase of a series resistance of the switch device and an increase of the real-time current change rate. Therefore, when determining the degradation mechanism of the internal defects and packaging of the switch device, it is confirmed based on a decrease of the real-time current change rate that the internal defect degradation of the switch device is caused by the increase of the oxide layer defect density. When the real-time current change rate increases, it is determined through a secondary testing including the on-state resistance and low-frequency noise testing that the degradation of the switch device is caused by accurate packaging and/or the increase of the interface defect density.

During use, both the packaging and internal defects of the switch device may degrade. When the oxide layer defect becomes saturated, the real-time current change rate no longer decreases. At this point, if the degradation degree of packaging or interface defect worsens, it will cause the real-time current change rate to increase. Thereafter, the real-time current change rates of the switch device during the on-state at different time points are collected. When the real-time current change rate of the drain-source current in the next time is greater than the real-time current change rate collected currently, it is determined that the degradation of the switch device is caused by more than two degradation mechanisms. Subsequently, the on-state resistance and interface defect density are further detected to accurately identify causes of the degradation.

In determining the degradation degree of the oxide layer defect and the interface defect individually, different first change amplitudes are determined to correspond with the varying degradation degrees of the oxide layer defect and the interface defect. The degradation degree of the oxide layer defect or the interface defect is confirmed based on the first change amplitude.

The radio frequency current probe is used to inspect the loop, a contact between the probe and the wire of the loop can detect the real-time current change rate without altering a layout of the power conversion circuit, making it easy to install. Meanwhile, the heat dispassion device is disposed to dissipate heat from the switch device, preventing excessive temperature changes during operation that could cause variations in the real-time current change rate, thus avoiding interference with the degradation monitoring due to significant temperature fluctuations.

Compared to the related art, the method for monitoring the degradation mechanism of the switch device provided by the disclosure determines the degradation mechanism of the internal defects of the switch device according to the change trend of the real-time current change rate.

BRIEF DESCRIPTION OF DRAWINGS

Through the illustrated embodiments of the disclosure as shown in the accompanying drawings, the above and other purposes, features, and advantages of the disclosure become clearer. In all the accompanying drawings, the same reference numerals indicate the same parts, and the drawings are not necessarily to scale. The emphasis is on showing the main idea of the disclosure.

Figure 1A:
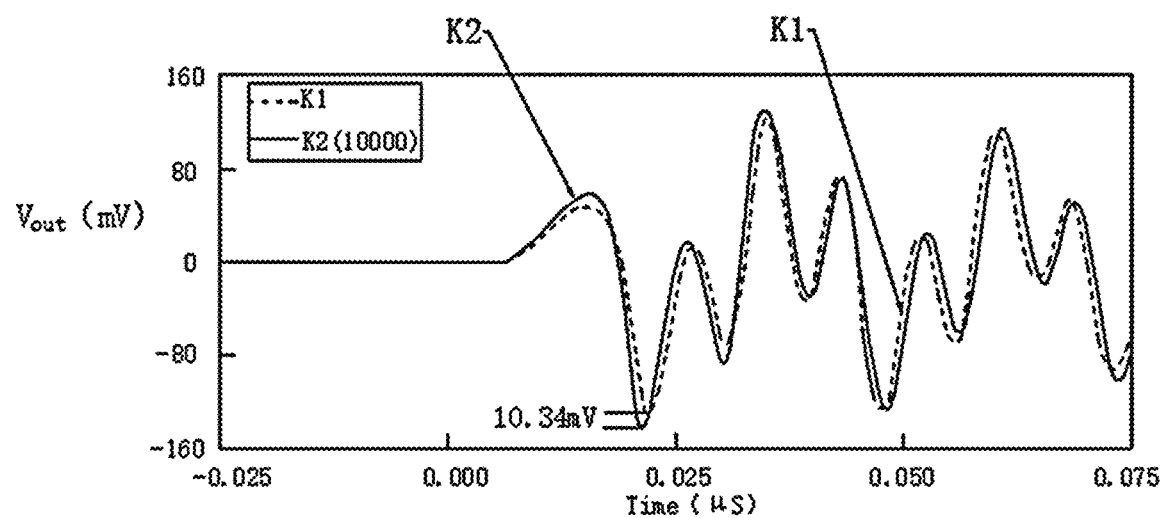
FIG. 1A to FIG. 1C illustrate schematic diagrams of changes associated with current change rates of a drain-source current according to the disclosure.

Description of reference numerals: K1 represents a curve corresponding to a reference current change rate of the drain-source current of a switch device; K2 represents a curve corresponding to a real-time change trend of the drain-source current of the switch device during a 10,000th power cycle; K3 represents a curve corresponding to a real-time change trend of the drain-source current of the switch device during a 15,000th power cycle; and K4 represents a curve corresponding to a real-time change trend of the drain-source current of the switch device during a 27,500th power cycle.

DETAILED DESCRIPTION OF EMBODIMENTS

A further detailed description of the technical solution of the disclosure is provided below in conjunction with the accompanying drawings and specific embodiments, to enable those skilled in the art to better understand and implement the disclosure. However, the illustrated embodiments are not intended to limit the disclosure. In the embodiments, it should be understood that terms "longitudinal", "transverse", "above", "below", "front", "rear", "left", "right", "vertical", "horizontal", "top", "bottom", "inside", "outside" and other directional or positional relationships indicated are based on the directional or positional relationships shown in the accompanying drawings, and are only for the convenience of describing the disclosure, rather than indicating or implying that the device or component must have a specific orientation, be constructed and operated in a specific orientation. Therefore, these cannot be understood as limiting the disclosure.

It should be noted that when an element is referred to as being "connected" to another element, the element may be directly connected to and integrated with the another element, or there may be an intermediate element present. The terms "installed", "an end", "another end", and similar expressions used in the disclosure are for illustrative purposes only.

Embodiment 1

The Embodiment 1 provides a method for monitoring a degradation mechanism of a switch device in a power conversion circuit, including the following steps S1-S5.

S1, a sensor is disposed on a loop where a source and a drain of the switch device are located.

S2, a reference current change rate of a drain-source current of the switch device is obtained.

S3, the sensor collects a real-time current change rate of the drain-source current when the switch device is in an on-state.

S4, the real-time current change rate of the drain-source current is compared with the reference current change rate of the drain-source current.

S5, the degradation mechanism of internal defects of the switch device is determined according to a change trend of the real-time current change rate, it is judged that degradation is caused by an increase of an oxide layer defect density of the switch device when the real-time current change rate is decreased, it is judged that degradation is caused by an increase of an interface defect density when the real-time current change rate is increased.

In the step S5, the step "the degradation mechanism of internal defects of the switch device is determined according to a change trend of the real-time current change rate" specifically includes: a relationship between the oxide layer defect density Not and the real-time current change rate $\partial i_D(t)/\partial t$, and a relationship between the interface defect density Nit and the real-time current change rate $\partial i_D(t)/\partial t$ are calculated according to the following formulas:

| | |
|---|---|
| $\partial i_D(t)/\partial t=[(V_G-V_{TH})/(R_G C_{oss}/g_m)+L_{loop}];$ | a first formula: |
| $\partial V_{TH}/\partial N_{it}=q/C_{ox}>0;$ | a second formula: |
| $\partial V_{TH}/\partial N_{ot}=q/C_{ox}<0;$ | a third formula: |
| $\partial g_m/\partial N_{it}<0;$ | a fourth formula: |
| $\partial g_m/\partial N_{ot}>0;$ | a fifth formula: | where $V_G$ represents a gate voltage, VTH represents a threshold voltage, $R_G$ represents a resistance of the loop where the source and the drain are located, $C_{oss}$ represents a capacitance of the loop where the source and the drain are located, $L_{loop}$ represents an inductance of the loop where the source and the drain are located, $C_{ox}$ represents a gate oxide layer capacitance, q represents a charge quantity of electron, and $g_m$ represents a transconductance. Through calculations with the formulas, it is determined that the oxide layer defect density is positively correlated with the change trend of the real-time current change rate, while the interface defect density is negatively correlated with the change trend of the real-time current change rate.

The second formula and the third formula are derived through $V_{th(chip)}=V_{th0}-(qN_{ot}/C_{ox})+(qN_{it}/C_{ox});$ where q represents the charge quantity of the electron, $V_{th0}$ represents an initial threshold voltage, and $V_{th(chip)}$ represents a threshold voltage when chip internal degradation occurs; and thus, it is determined that the change of the threshold voltage $V_{TH}$ is related to the oxide layer defect density $N_{ot}$ and the interface defect density $N_{it}$.

The fourth formula and the fifth formula are derived through $g_m=C_{ox}\times\mu[W(V_G-V_{TH})/L]$ and $\mu=\mu/(1+\alpha_{ot}\times N_{ot}+\alpha_{it}\times N_{it});$ where $C_{ox}$ represents the gate oxide layer capacitance, $\mu$ represents an electron mobility, $\mu_0$ represents an initial value of the electron mobility, $\alpha_{ot}$ represents an effect coefficient of the oxide layer defect density $N_{ot}$, and $\alpha_{it}$ represents an effect coefficient of the interface defect density $N_{it}$, and thus it is determined that the transconductance $g_m$ is related to the oxide layer defect density $N_{ot}$ and the interface defect density $N_{it}$.

When the embodiment 1 individually determines the degradation mechanism of the internal defects of the switch device, it is determined based on an increase or a decrease of the real-time current change rate that the internal defect degradation of the switch device is caused by the increase of the oxide layer defect density or the increase of the interface defect density.

Figure 1B:
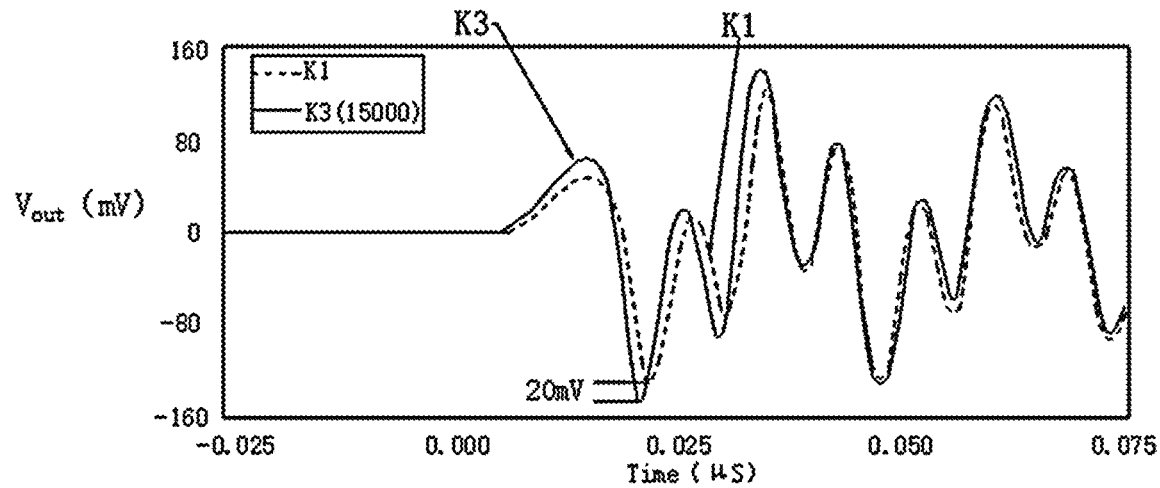

As illustrated in FIG. 1A to FIG. 1B, K1 represents a curve corresponding to the reference current change rate of the drain-source current of the switch device; K2 represents a curve corresponding to a real-time change trend of the drain-source current of the switch device during a 10,000th power cycle; K3 represents a curve corresponding to a real-time change trend of the drain-source current of the switch device during a 15,000th power cycle; and K4 represents a curve corresponding to a real-time change trend of the drain-source current of the switch device during a 27,500th power cycle. As shown in FIG. 1A, a minimum value of K2 decreases by 10.34 millivolts (mV) relative to a minimum value of K1, indicating a reduction in the real-time current change rate, which leads to a conclusion that during the 10,000th power cycle, the internal defect degradation of the switch device is caused by an increase of the oxide layer defect density.

As shown in FIG. 1B, a minimum value of K3 decreases by 20 mV relative to the minimum value of K1, indicating a reduction in the real-time current change rate. It is judged that during the 15,000th power cycle, the internal defect degradation of the switch device is caused by an increase of the oxide layer defect density. Meanwhile, the minimum value of K3 continues to decrease relative to the minimum value of K2, which confirms that the oxide layer defect density continues to increase, and the severity of the internal defect degradation of the switch device at K3 compared to K2 has intensified.

In a specific embodiment, the step S5 further includes the following steps. A relationship between a first change amplitude of the real-time current change rate of the drain-source current relative to the reference current change rate of the drain-source current and a degradation degree of an oxide layer defect is preset, and the degradation degree of the oxide layer defect is determined based on the first change amplitude.

A relationship between the first change amplitude of the real-time current change rate of the drain-source current relative to the reference current change rate of the drain-source current and a degradation degree of an interface defect is preset, and the degradation degree of the interface defect is determined based on the first change amplitude. When determining the degradation degrees of the oxide layer defect and the interface defect individually, different first change amplitudes are preset to correspond with the varying degradation degrees of the oxide layer defect and the interface defect. The degradation degree of the oxide layer defect or the interface defect is confirmed based on the first change amplitude.

In a specific embodiment, the sensor is a radio frequency current probe. The sensor is disposed in the step S1 as follows: the radio frequency current probe is disposed to be in contact with a surface of a wire of the loop where the source and drain are located. The radio frequency current probe is used to inspect the loop, a contact between the probe to the wire in the loop can detect the real-time current change rate without altering a layout of the power conversion circuit, making it easy to install.

The step S1 further includes: a heat dissipation device is disposed on the switch device, and the step S1 further includes: the heat dissipation device is activated. In a specific embodiment, the heat dissipation device is a water-cooling heat dissipation device. The heat dispassion device is disposed to dissipate heat from the switch device, preventing excessive temperature changes during operation that could cause variations in the real-time current change rate, thus avoiding interference with the degradation monitoring due to significant temperature fluctuations.

Embodiment 2

The Embodiment 2 provides a method for monitoring a degradation mechanism of a switch device in a power conversion circuit, including the following steps S1-S5.

S1, a sensor is disposed on a loop where a source and a drain of the switch device are located.

S2, a reference current change rate of a drain-source current of the switch device is obtained.

S3, the sensor collects a real-time current change rate of the drain-source current when the switch device is in an on-state.

S4, the real-time current change rate of the drain-source current is compared with the reference current change rate of the drain-source current.

S5, the degradation mechanism of internal defects of the switch device is determined according to a change trend of the real-time current change rate, it is judged that packaging degradation, internal defect degradation caused by an increase of an oxide layer defect density, internal defect degradation caused by an increase of an interface defect density, or both packaging degradation and internal defect degradation caused by the increase of the interface defect density occurred on the switch device.

The step S5 specifically includes the following steps A1-A3.

A1, in response to the real-time current change rate being decreased, it is judged that degradation is internal defect degradation of the switch device caused by the increase of the oxide layer defect density; whereas, in response to the real-time current change rate being increased, the following step A2 is performed.

A2, in a linear region, a real-time on-state resistance is compared with a reference on-state resistance, and the interface defect density of the switch device is simultaneously tested through low-frequency noise.

A3, in response to the real-time on-state resistance being less than the reference on-state resistance and the interface defect density being increased, it is judged that degradation is internal defect degradation of the switch device caused by the increase of the interface defect density;

in response to the real-time on-state resistance being greater than the reference on-state resistance and the interface defect density being with no change, it is judged that degradation of the switch device is packaging degradation;

in response to the real-time on-state resistance being greater than the reference on-state resistance and the interface defect density being increased, it is judged that both packaging degradation, and internal defect degradation of the switch device caused by the increase of the interface defect density occurred on the switch device.

In the Embodiment 2, the oxide layer defect density is positively correlated with the change trend of the real-time current change rate, while the interface defect density is negatively correlated with the change trend of the real-time current change rate. A method to confirm the correlation between the oxide layer defect density, the interface defect density, and the real-time current change rate is the same as in the Embodiment 1. Meanwhile, when packaging degradation of the switch device occurs, the series resistance of the switch device increases, thereby leading to an increase of the current change rate.

The degradation of the switch device includes internal defect degradation and packaging degradation. When it is necessary to confirm the degradation mechanism of the switch device, the change trend of the real-time current change rate is first confirmed. It is confirmed based on a decrease in the real-time current change rate that the internal defect degradation of the switch device is caused by the increase of the oxide layer defect density. When the real-time current change rate increases, it is determined through a secondary testing including the on-state resistance and low-frequency noise testing that the degradation of the switch device is caused by accurate packaging and/or the increase of the interface defect density.

During the use of the switch device, as the usage time of the switch device extends, the degradation may occur in both the packaging and the internal defects of the switch device.

In a specific embodiment, after judging that degradation is internal defect degradation caused by the increase of the oxide layer defect density, the step A1 further includes the following steps.

A real-time current change rate of the drain-source current is collected during the switch device is in an on-state in a next time; in response to a change trend of the real-time current change rate of the drain-source current in the next time relative to the real-time current change rate collected in the S3 being relatively increased compared to the change trend of the real-time current change rate collected in the S3 relative to the reference current change rate, the real-time on-state resistance in the linear region is measured, and the interface defect density of the switch device is simultaneously tested through the low-frequency noise;

in response to the real-time on-state resistance being greater than the reference on-state resistance and the interface defect density being increased, it is judged that packaging degradation and internal defect degradation of the switch device caused by the increase of the oxide layer defect density and the increase of the interface defect density occurred during the switch device is in use;

in response to the real-time on-state resistance being greater than the reference on-state resistance and the interface defect density being with no change, it is judged that packaging degradation and internal defect degradation of the switch device caused by the increase of the interface defect density occurred during the switch device is in use;

in response to the real-time on-state resistance being less than the reference on-state resistance and the interface defect density being increased, it is judged that internal defect degradation caused by the increase of the oxide layer defect density and internal defect degradation caused by the increase of the interface defect density occurred during the switch device is in use.

In the method above, the real-time current change rate is changed when the degradation occurs in the packaging or at the interface. Accordingly, by collecting the real-time current change rates of the switch device during on-state at different time points, if the real-time current change rate of the drain-source current in the next time increases relative to the previous one, it is determined that the degradation of the switch device is caused by more than two mechanisms. Subsequently, further detection of the on-state resistance and interface defect density is carried out to accurately identify the causes of the degradation.

Figure 1C:
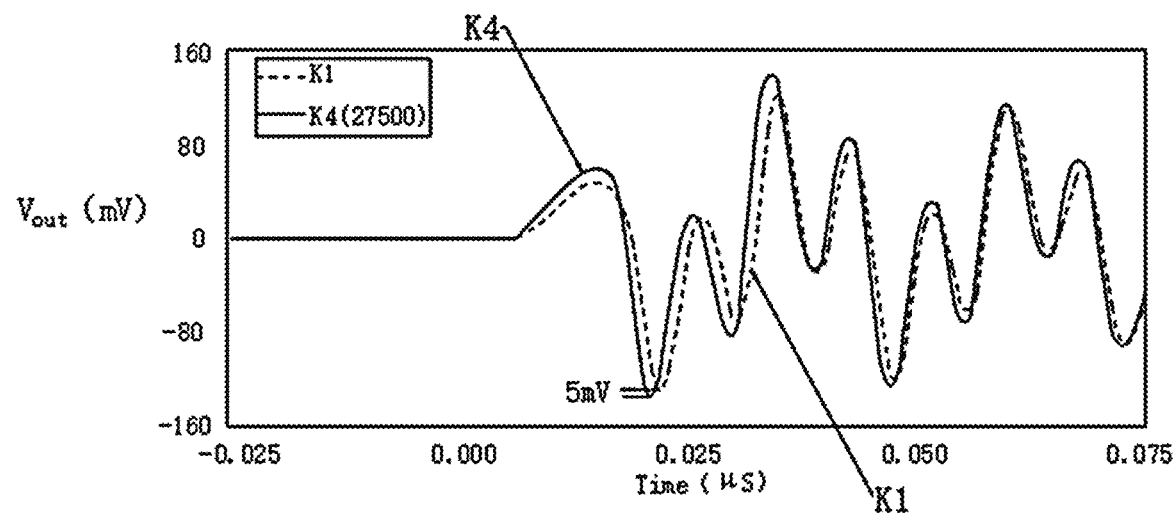

As illustrated in FIG. 1A to FIG. 1C, K1 represents a curve corresponding to the reference current change rate of the drain-source current of the switch device; K2 represents a curve corresponding to a real-time change trend of the drain-source current of the switch device during a 10,000th power cycle; K3 represents a curve corresponding to a real-time change trend of the drain-source current of the switch device during a 15,000th power cycle; and K4 represents a curve corresponding to a real-time change trend of the drain-source current of the switch device during a 27,500th power cycle.

As shown in FIG. 1A, a minimum value of K2 decreases by 10.34 mV relative to a minimum value of K1, indicating a reduction in the real-time current change rate, which leads to a conclusion that during the 10,000th power cycle, the internal defect degradation of the switch device is caused by the increase of the oxide layer defect density.

As shown in FIG. 1B, a minimum value of K3 decreases by 20 mV relative to the minimum value of K1, indicating a reduction in the current change rate. It is judged that during the 15,000th power cycle, the internal defect degradation of the switch device is caused by an increase of the oxide layer defect density. Meanwhile, the minimum value of K3 continues to decrease relative to the minimum value of K2, which confirms that the oxide layer defect density continues to increase, and the severity of the internal defect degradation of the switch device at K3 compared to K2 has intensified.

Referring to FIG. 1C, a minimum value of K4 decreases by 5.7 mV relative to the minimum value of K1, indicating a reduction in the current change rate. It is judged that after the 27,500 power cycles, there is still internal defect degradation of the switch device caused by an increase of the oxide layer defect density. At the same time, the minimum value of K4 increases relative to the minimum value of K3, indicating that degradation also occurs in the packaging or the interface of the switch device. At this point, the on-state resistance and low-frequency noise testing are used to confirm whether there are anomalies in the packaging and the interface of the switch device, thereby determining whether it is the packaging degradation or the internal defect degradation of the switch device caused by the increase of the interface defect density, or both the packaging degradation and the internal defect degradation caused by the increase of the interface defect density.

In the embodiment, in the step A1, A relationship between a first change amplitude of the real-time current change rate of the drain-source current relative to the reference current change rate of the drain-source current and a degradation degree of an oxide layer defect is preset, and the degradation degree of the oxide layer defect is determined based on the first change amplitude. When determining the degradation degrees of the oxide layer defect and the interface defect individually, different first change amplitudes are determined to correspond with the varying degradation degrees of the oxide layer defect and the interface defect. The degradation degree of the oxide layer defect or the interface defect is confirmed through the first change amplitude.

In the step A3, when determining the degradation degree of the switch device that first experiences the oxide layer defect degradation and then other types of degradation, the degradation degree of the oxide layer defect is first determined based on the first change rate; and subsequent judgments are then made.

The correlation between the interface defect density and the degradation degree of the interface defect is preset. When the switch device exhibits the interface defect degradation, the degradation degree of the interface defect is determined based on current interface defect density.

The correlation of a resistance change rate of the real-time on-state resistance compared to the reference on-state resistance is preset. When the switch device experiences the packaging degradation, the degradation degree of the packaging is determined by current resistance change rate.

In the disclosure, the switch device is used in the power conversion circuit, and the power conversion circuit includes a direct current (DC)-DC power supply, an alternating current (AC)-DC power supply, or a DC-AC inverter. The switch device includes a metal-oxide-semiconductor field-effect transistor (MOSFET) or an insulated gate bipolar transistor (IGBT) based on a silicon carbide (SiC) or silicon (Si) material.

Figure 2:
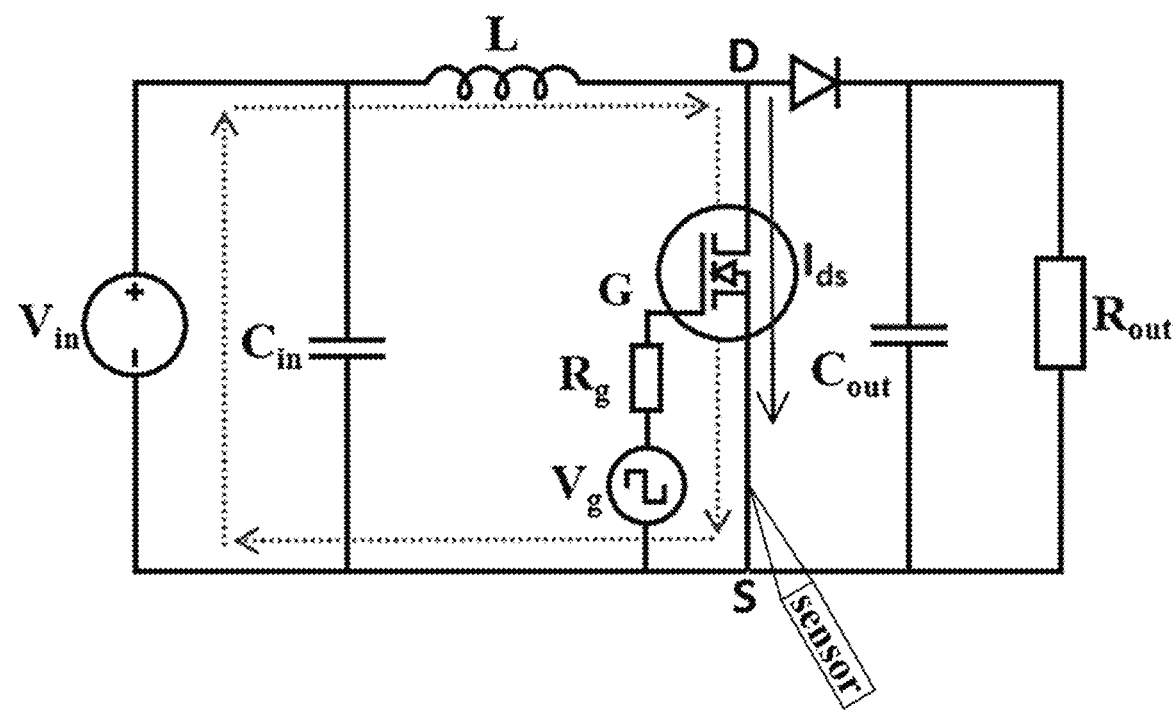
FIG. 2 illustrates a schematic diagram of a power conversion circuit according to the disclosure.

Referring to FIG. 2, the power conversion circuit includes an input power supply $V_{in}$, an inductor L, an input capacitor $C_{in}$, an output capacitor $C_{out}$, an output resistor Rout, a gate resistor $R_g$, a control switch $V_g$, a diode, and the switching device; and the switching device is a MOSFET.

The drain D of the switching device is connected to an end of the input power supply $V_{in}$ of the power conversion circuit through the inductor L, and the source S of the switching device is connected to another end of the input power supply $V_{in}$ of the power conversion circuit; the source S of the switching device is also connected to the control switch $V_g$, which is connected to the gate G of the switching device through the gate resistor $R_g$; the control switch $V_g$ is configured to control the start and shutdown of the switching device; the drain D of the switching device is also connected to a positive pole of the diode, and a negative pole of the diode is connected to the source S of the switching device through the resistor $R_{out}$; an input capacitor $C_{in}$ is connected between the source S of the switching device and the inductor L; an output capacitor $C_{out}$ is connected between the diode and the source S of the switching device; two ends of the resistor $R_{out}$ are connected to the output end of the power conversion circuit.

Referring to FIG. 2, the loop is formed between the drain D of the switching device, the source S of the switching device, the input power supply $V_{in}$, and the inductor L; the current flows sequentially through the drain D of the switching device, the source S of the switching device, the input power supply $V_{in}$, and the inductor L followed by returning to the drain D of the switching device. Also referring to FIG. 2, the wire of the loop where the source S and drain D are located is a circuit line directed from the drain D to the source S; and Ids represents the drain-source current.

In the disclosure, unless otherwise specified and limited, a first feature "on" or "under" a second feature may be in direct contact with the second feature, or the first and second features may be in indirect contact through an intermediate medium. Moreover, the first feature being "on" or "above" the second feature may indicate that the first feature is directly above or diagonally above the second feature, or simply that the first feature is horizontally higher than the second feature. The first feature being "under" or "beneath" the second feature may indicate that the first feature is located directly or diagonally below the second feature, or simply indicate that the first feature has a lower horizontal height than the second feature.

In the description herein, the reference to terms such as "preferred embodiments", "further embodiments", "other embodiments", or "specific embodiments" means that specific features, structures, materials, or characteristics described in conjunction with the embodiments or examples are included in at least one embodiment or example of the disclosure. The schematic expressions of the above terms herein do not necessarily refer to the same embodiments or examples. Moreover, the specific features, structures, materials, or characteristics described can be combined in any one or more embodiments or examples in an appropriate manner. In addition, those skilled in the art can combine and combine the different embodiments or examples described herein, as well as the features of different embodiments or examples, without conflicting with each other.

Although the embodiments of the present disclosure are shown and described above, it can be understood that the above embodiments are exemplary and should not be construed as limiting the present disclosure. Those skilled in the art may make amendments, modifications, substitutions, and variations to the above embodiments within the scope of the present disclosure.

What is claimed is:

1. A method for monitoring a degradation mechanism of a switch device in a power conversion circuit, comprising:
    S1, disposing a sensor on a loop where a source and a drain of the switch device are located;
    S2, obtaining a reference current change rate of a drain-source current of the switch device;
    S3, collecting, by the sensor, a real-time current change rate of the drain-source current during the switch device is in an on-state;
    S4, comparing the real-time current change rate of the drain-source current with the reference current change rate of the drain-source current; and
    S5, determining the degradation mechanism of internal defects of the switch device according to a change trend of the real-time current change rate, judging that degradation is caused by an increase of an oxide layer defect density of the switch device when the real-time current change rate is decreased, judging that degradation is caused by an increase of an interface defect density when the real-time current change rate is increased;
    wherein the determining the degradation mechanism of internal defects of the switch device according to a change trend of the real-time current change rate, specifically comprises the following steps:
    A1, in response to the real-time current change rate being decreased, judging that degradation is internal defect degradation of the switch device caused by the increase of the oxide layer defect density; whereas, in response to the real-time current change rate being increased, performing the following step A2;
    A2, comparing a real-time on-state resistance with a reference on-state resistance, in a linear region; and testing the interface defect density of the switch device through low-frequency noise;
    A3, in response to the real-time on-state resistance being less than the reference on-state resistance and the interface defect density being increased, judging that degradation is internal defect degradation of the switch device caused by the increase of the interface defect density;
        in response to the real-time on-state resistance being greater than the reference on-state resistance and the interface defect density being with no change, judging that degradation of the switch device is packaging degradation;
        in response to the real-time on-state resistance being greater than the reference on-state resistance and the interface defect density being increased, judging that both packaging degradation, and internal defect degradation of the switch device caused by the increase of the interface defect density occurred on the switch device.

2. The method for monitoring the degradation mechanism of the switch device in the power conversion circuit as claimed in claim 1, wherein the determining the degradation mechanism of internal defects of the switch device according to a change trend of the real-time current change rate, specifically comprises:

calculating a relationship between the oxide layer defect density $N_{ot}$ and the real-time current change rate $\partial i_D(t)/\partial t$, and a relationship between the interface defect density Nit and the real-time current change rate $\partial i_D(t)/\partial t$ according to the following formulas:

$\partial i_D(t)/\partial t=[(V_G-V_{TH})/(R_G C_{oss}/g_m)+L_{loop}]$;

$\partial V_{TH}/\partial N_{it}=q/C_{ox}>0$;

$\partial V_{TH}/\partial N_{ot}=q/C_{ox}<0$;

$\partial g_m/\partial N_{it}<0$;

$\partial g_m/\partial N_{ot}>0$;

where $V_G$ represents a gate voltage, $V_{TH}$ represents a threshold voltage, $R_G$ represents a resistance of the loop where the source and the drain are located, $C_{oss}$ represents a capacitance of the loop where the source and the drain are located, $L_{loop}$ represents an inductance of the loop where the source and the drain are located, $C_{ox}$ represents a gate oxide layer capacitance, q represents a charge quantity of electron, and $g_m$ represents a transconductance.

3. The method for monitoring the degradation mechanism of the switch device in the power conversion circuit as claimed in claim 1, wherein the step S5 further comprises:

collecting a real-time current change rate of the drain-source current during the switch device is in an on-state in a next time; in response to the real-time current change rate of the drain-source current in the next time being relatively increased compared to the real-time current change rate collected in the S3, measuring the real-time on-state resistance in the linear region, and simultaneously testing the interface defect density of the switch device through the low-frequency noise;

in response to the real-time on-state resistance being greater than the reference on-state resistance and the interface defect density being increased, judging that packaging degradation and internal defect degradation of the switch device caused by the increase of the oxide layer defect density and the increase of the interface defect density occurred during the switch device is in use;

in response to the real-time on-state resistance being greater than the reference on-state resistance and the interface defect density being with no change, judging that packaging degradation and internal defect degradation of the switch device caused by the increase of the interface defect density occurred during the switch device is in use;

in response to the real-time on-state resistance being less than the reference on-state resistance and the interface defect density being increased, judging that internal defect degradation caused by the increase of the oxide layer defect density and the increase of the interface defect density occurred during the switch device is in use.

4. The method for monitoring the degradation mechanism of the switch device in the power conversion circuit as claimed in claim 1, wherein the step S5 further comprises:

presetting a relationship between a first change amplitude of the real-time current change rate of the drain-source current relative to the reference current change rate of the drain-source current and a degradation degree of an oxide layer defect, and determining the degradation degree of the oxide layer defect based on the first change amplitude.

5. The method for monitoring the degradation mechanism of the switch device in the power conversion circuit as claimed in claim 1, wherein the step S5 further comprises:

presetting a relationship between a first change amplitude of the real-time current change rate of the drain-source current relative to the reference current change rate of the drain-source current and a degradation degree of an interface defect, and determining the degradation degree of the interface defect based on the first change amplitude.

6. The method for monitoring the degradation mechanism of the switch device in the power conversion circuit as claimed in claim 1, wherein the sensor is a radio frequency current probe; and the disposing a sensor in the S1 specifically comprises: disposing the radio frequency current probe to be contacted with a surface of a wire of the loop where the source and drain are located.

7. The method for monitoring the degradation mechanism of the switch device in the power conversion circuit as claimed in claim 1, wherein a heat dissipation device is disposed on the switch device, and the S1 further comprises: activating the heat dissipation device.

8. The method for monitoring the degradation mechanism of the switch device in the power conversion circuit as claimed in claim 7, wherein the heat dissipation device is a water-cooling heat dissipation device.

\* \* \* \* \*